United States Patent
Lee

(10) Patent No.: US 11,101,004 B1
(45) Date of Patent: Aug. 24, 2021

(54) MEMORY DEVICE AND READING METHOD

(71) Applicant: MACRONIX International Co., Ltd., Hsinchu (TW)

(72) Inventor: Ya-Jui Lee, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/908,328

(22) Filed: Jun. 22, 2020

(51) Int. Cl.
| G11C 16/04 | (2006.01) |
| G11C 16/34 | (2006.01) |
| G11C 16/26 | (2006.01) |
| G11C 16/30 | (2006.01) |
| G11C 16/08 | (2006.01) |
| G11C 16/10 | (2006.01) |
| G11C 16/24 | (2006.01) |

(52) U.S. Cl.
CPC .......... G11C 16/3404 (2013.01); G11C 16/08 (2013.01); G11C 16/10 (2013.01); G11C 16/24 (2013.01); G11C 16/26 (2013.01); G11C 16/30 (2013.01)

(58) Field of Classification Search
CPC ..... G11C 16/3404; G11C 16/08; G11C 16/18; G11C 16/24; G11C 16/26; G11C 16/30
See application file for complete search history.

(56) References Cited

U.S. PATENT DOCUMENTS

| 8,406,050 B2* | 3/2013 | Tang ................. G11C 16/0483 365/185.03 |
| 9,117,540 B2* | 8/2015 | Shim ................. G11C 16/3436 |
| 10,699,792 B2* | 6/2020 | Maejima ............... G11C 16/08 |
| 2012/0250419 A1 | 10/2012 | Nawata et al. |

OTHER PUBLICATIONS

"Office Action of Taiwan Counterpart Application", dated Jan. 15, 2021, pp. 1-5.

* cited by examiner

*Primary Examiner* — Pho M Luu
(74) *Attorney, Agent, or Firm* — J.C. Patents

(57) ABSTRACT

A memory device and a reading method thereof are provided. During a second reading period, a second bit line voltage is provided to a bit line having a read finished memory cell. Thus, a voltage difference between a bit line voltage and a pass voltage of memory cells on unselected word lines is reduced. A data value stored in the memory cells on a selected word line is determined according to whether the memory cells on the selected word line enter a preset state during a first reading period and the second reading period.

10 Claims, 8 Drawing Sheets

MEMORY DEVICE AND READING METHOD

BACKGROUND OF THE INVENTION

1. Field of the Invention

The invention relates to an electronic device, in particular to a memory device and a reading method thereof.

2. Description of Related Art

With the development of storage technology, various memories are continuously developed. Flash memories can store data through electronic erasing and writing or programming, and are widely applied to memory cards, solid-state drives, portable multimedia players, and the like. Since the flash memories are non-volatile memories, no additional power is needed to maintain information stored in the flash memories.

Due to some factors, the number of originally stored charges in a flash memory cell may be affected or disturbed. For example, the disturbance in the flash memory may come from reading disturbance, that is, with the increase of the number of uses, the method of reading the memory may affect adjacent memory cells of the same memory block. For example, when data are read from multi level cells, triple level cells and quadruple level cells, it is necessary to read the selected memory cells many times such that the reading time is lengthened, while the number of charges stored in the unselected memory cells in a memory string may change due to the lengthening of the reading time, thereby influencing the correctness of stored data.

SUMMARY OF THE INVENTION

A memory device provided by the invention includes a plurality of memory strings, a plurality bit lines, a plurality word lines and a control circuit. Each memory string includes a plurality of memory cells. Each memory cell includes a threshold voltage indicating a stored data value. Each bit line of the plurality bit lines is coupled to each corresponding memory string respectively. Each word line of the plurality word lines is coupled to each corresponding memory cell in the plurality of memory string respectively. The control circuit is coupled to the plurality of memory strings. During a first reading period, a first reading voltage is provided to a selected word line. A passing voltage is provided to unselected word lines. A first bit line voltage is provided to each bit line. A memory cell on the selected word line that enters a preset state is determined as a read finished memory cell. A memory cell on the selected word line that does not enter the preset state is determined as a read unfinished memory cell. During a second reading period, a second reading voltage is provided to the selected word line. The passing voltage is provided to the unselected word lines. The first bit line voltage is provided to a bit line having the read unfinished memory cell. A second bit line voltage is provided to a bit line having the read finished memory cell. The first bit line voltage is different from the second bit line voltage. A data value stored in the memory cells on the selected word line is determined according to whether the memory cells on the selected word line enter the preset state during the first reading period and the second reading period.

In a reading method of the memory device provided by the invention, the memory device includes a plurality of memory strings, a plurality bit lines and a plurality word lines. Each memory string comprises a plurality of memory cells. Each memory cell includes a threshold voltage indicating a stored data value. Each bit line of the plurality bit lines is coupled to each corresponding memory string respectively. Each word line of the plurality word lines being coupled to each corresponding memory cell in the plurality of memory string respectively. The reading method of the memory device includes the following steps. During a first reading period, a first reading voltage is provided to a selected word line. A passing voltage is provided to unselected word lines. A first bit line voltage is provided to each bit line. A memory cell on the selected word line that enters a preset state is determined as a read finished memory cell. A memory cell on the selected word line that does not enter the preset state is determined as a read unfinished memory cell. During a second reading period, a second reading voltage is provided to the selected word line. The passing voltage is provided to the unselected word lines. The first bit line voltage is provided to a bit line having the read unfinished memory cell. A second bit line voltage is provided to a bit line having the read finished memory cell. The first bit line voltage is different from the second bit line voltage. A data value stored in the memory cells on the selected word line is determined according to whether the memory cells on the selected word line enter the preset state during the first reading period and the second reading period.

To make the features and advantages of the invention more comprehensible, a detailed description is made below with reference to the accompanying drawings by using embodiments.

DESCRIPTION OF THE EMBODIMENTS

Figure 1:
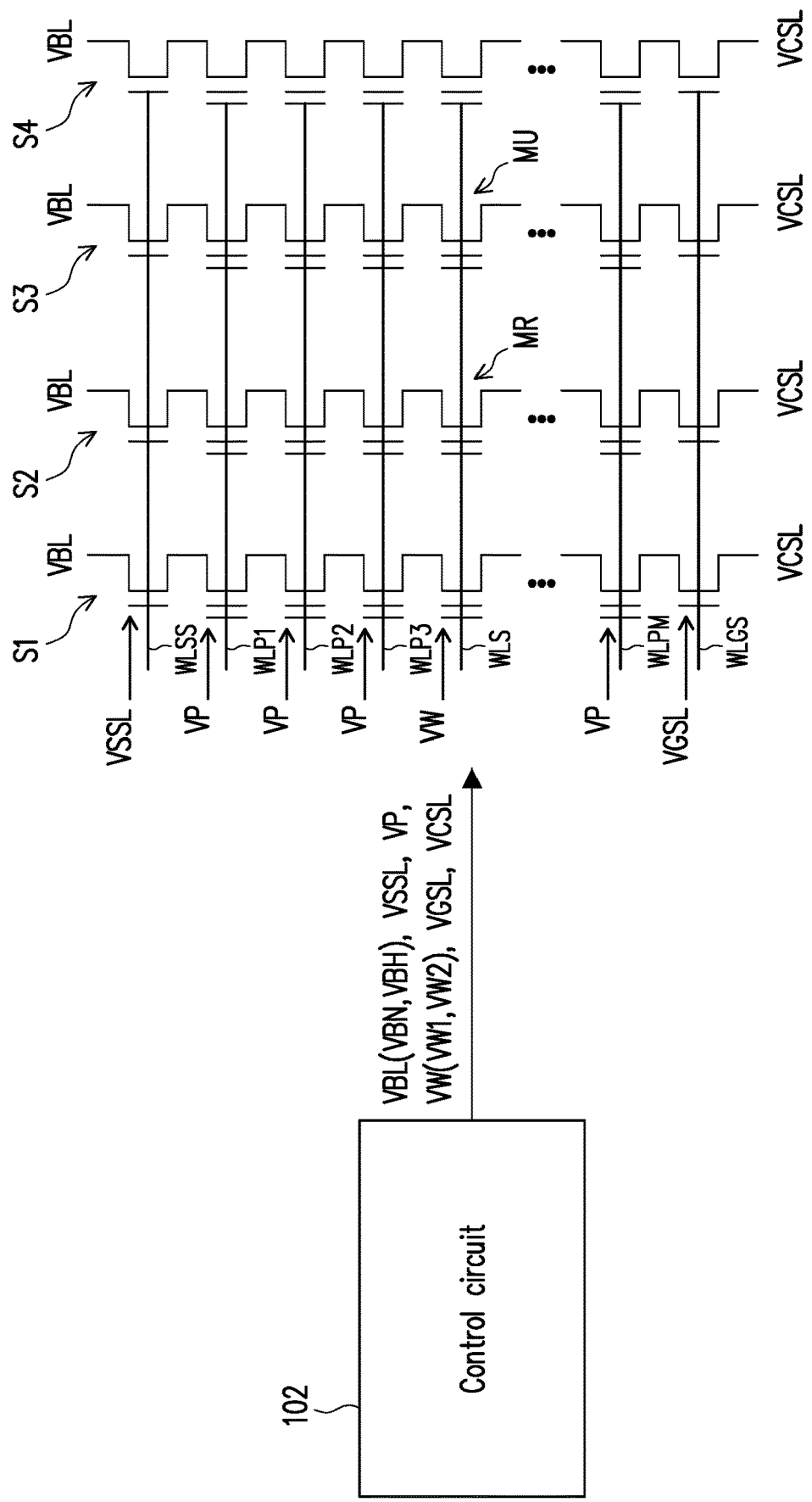
FIG. 1 is a schematic diagram of a memory device according to one embodiment of the invention.

FIG. 1 is a schematic diagram of a memory device according to one embodiment of the invention. The memory device includes a plurality of memory strings S1-S4 and a control circuit 102. Each memory cell includes a threshold voltage indicating a stored data value. Each of memory strings S1-S4 is coupled to a corresponding bit line respectively. Each memory cell in the memory strings S1-S4 is coupled to a corresponding word line respectively. The control circuit 102 is coupled to the memory strings S1-S4. The memory device may be a three-dimensional NAND flash memory device. Each memory string S1-S4 includes a string select transistor, a plurality of memory cells and a grounding select transistor. The memory cells may be, for example, multi level cells (MLCs), triple level cells (TLCs) or quadruple level cells (QLCs). In addition, although FIG. 1 only illustrates a memory block including memory strings S1-S4 to describe the memory device, the number of memory blocks and the number of memory strings included in the memory device are not limited to the present embodiment.

During the reading operation of the memory block consisting of memory strings S1-S4, the control circuit 102 may provide a bit line voltage VBL to memory strings S1-S4 through bit lines coupled to memory strings S1-S4. A string select voltage VSSL is provided to the string select transistor through a string select line WLSS. A grounding select voltage VGSL is provided to the grounding select transistor through a grounding select line WLGS. A reading voltage VW is provided to memory cells on a selected word line WLS. A passing voltage VP to memory cells is provided to unselected word lines WLP1-WLPM. A common source voltage VCSL is provided to a source of the grounding select transistor through a common source line.

Further, during a first reading period in the reading operation, the control circuit 102 may provide a first reading voltage VW1 to the selected word line WLS. A passing voltage VP is provided to the unselected word lines WLP1-WLPM. A first bit line voltage VBN is provided to bit lines coupled to the memory string S1-S4. The memory cells on the selected word line WLS about whether the memory cells entering a preset state is determined. A memory cell on the selected word line WLS that enters the preset state is determined as a read finished memory cell, and a memory cell on the selected word line WLS that does not enter the preset state is determined as a read unfinished memory cell. For example, suppose that the memory cell MR on the selected word line WLS in the memory string S2 enters the preset state, and the memory cell MU on the selected word line WLS in the memory string S3 does not enter the preset state, the memory cell MR is determined as a read finished memory cell, and the memory cell MU is determined as a read unfinished memory cell. As deduced by analogy, it can be determined whether the other memory cells on the selected word line WLS are read finished memory cells in the same way.

During a second reading period, the control circuit 102 may provide a second reading voltage VW2 to the selected word line WLS. The passing voltage VP is provided to the unselected word lines WLP1-WLPM. The first bit line voltage VBN is provided to a bit line having a read unfinished memory cell (eg, memory cell MU) determined in the first reading period. The second bit line voltage VBH to is provided a bit line having a read finished memory cell (eg, memory cell MR) determined in the first reading period. The control circuit 102 may also determine whether the memory cell on the selected word line WLS that did not entered the preset state during the first read period to enter the preset state. The second bit line voltage VBH is greater than the first bit line voltage VBN.

The control circuit 102 may determine a data value stored in the memory cells on the selected word line WLS according to whether the memory cells on the selected word line WLS enter the preset state during the first reading period and the second reading period. The preset state may be an on state or off state. For example, when the first reading voltage provided by the control circuit 102 is less than the second reading voltage, the preset state may be the on state. When the first reading voltage provided by the control circuit 102 is greater than the second reading voltage, the preset state may be the off state.

During the second reading period, the second bit line voltage VBH is provided to a bit line having the read finished memory cell (e.g., memory cell MR) determined in the first reading period. The voltage difference between the bit line voltage VBL and the passing voltage VP of the memory cells on the unselected word lines WLP1-WLPM in the memory string S2 which includes the read finished memory cell MR is reduced. The distortion of stored data of the memory cells on the unselected word lines WLP1-WLPM in the memory string S2 caused by the lengthening of the reading time can be avoided, thus effectively avoiding reading disturbance.

Figure 2:
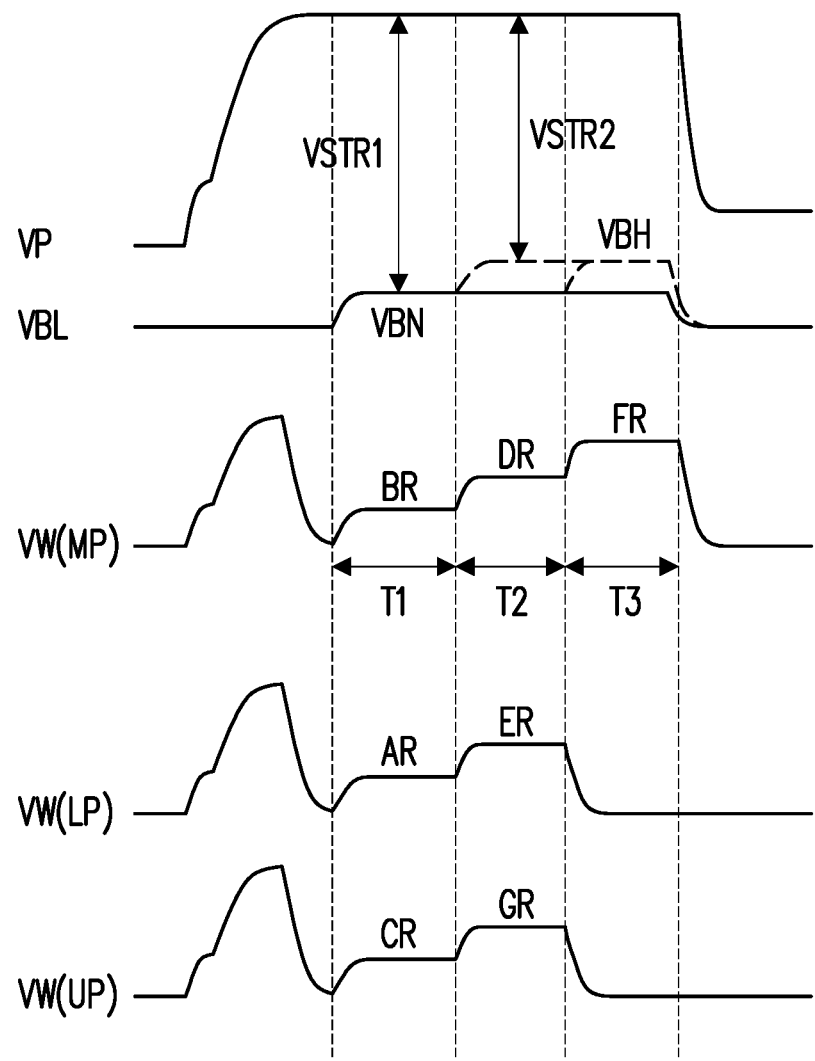
FIG. 2 is a voltage signal waveform diagram of a memory device according to one embodiment of the invention.
Figure 3:
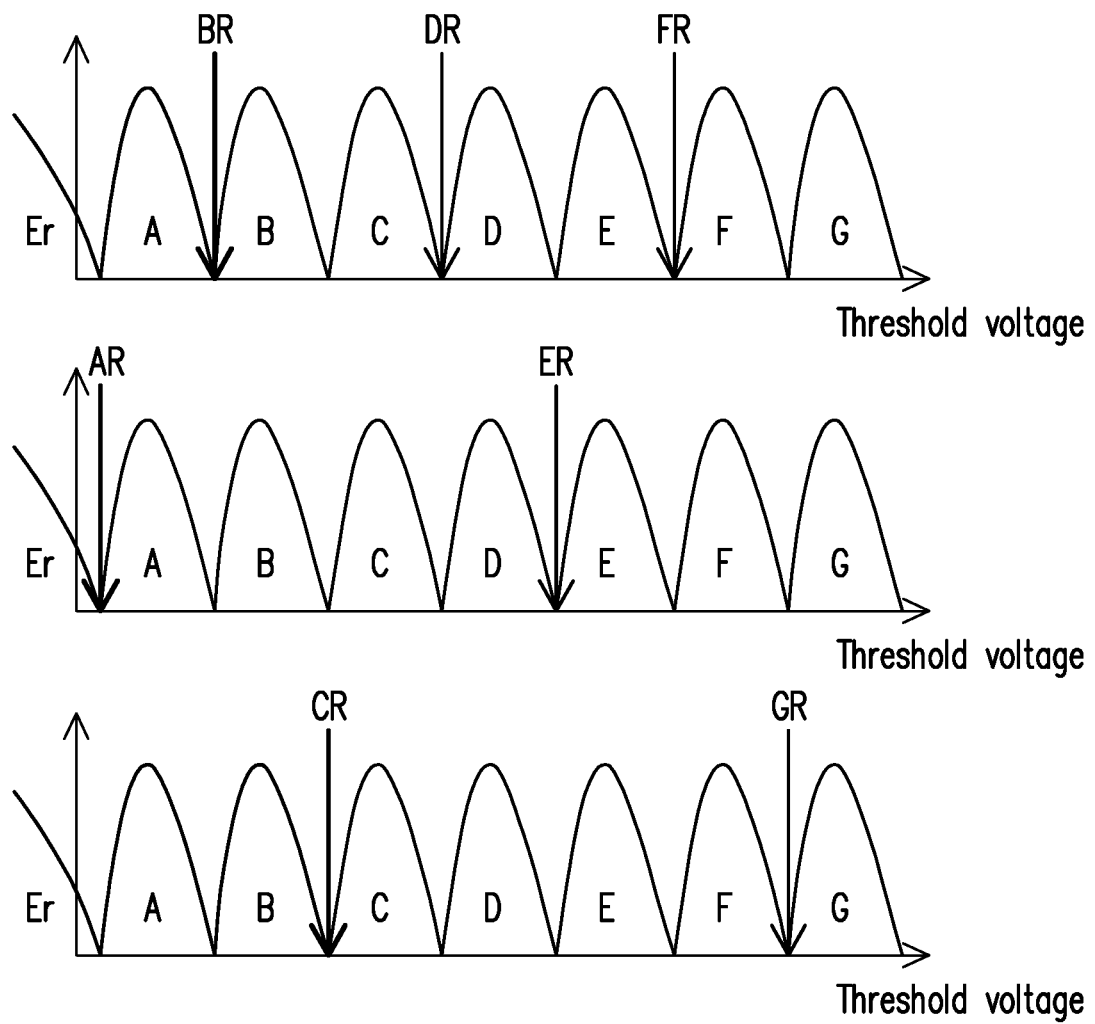
FIG. 3 is a schematic diagram of threshold voltage distribution of selected memory pages according to one embodiment of the invention.
Figure 4:
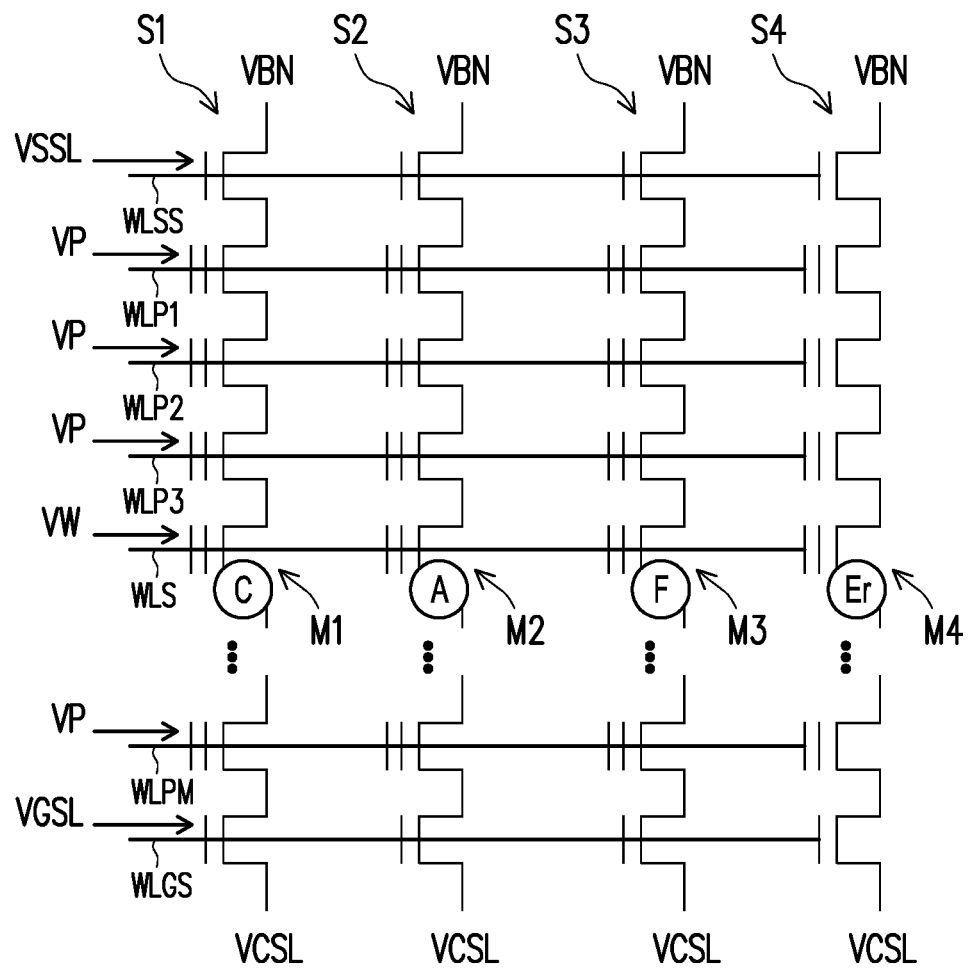
FIG. 4 to FIG. 6 are schematic diagrams of reading operations of memory blocks according to one embodiment of the invention.

In an example, the memory cells are capable of storing three-bit data. FIG. 2 is a voltage signal waveform diagram of a memory device according to one embodiment of the invention. FIG. 3 is a schematic diagram of threshold voltage distribution of selected memory pages according to one embodiment of the invention. FIG. 4 is schematic diagram of reading operation during a reading period T1 of memory blocks according to one embodiment of the invention. Please refer to FIG. 2 to FIG. 4. In an example, during a reading period T1 of the reading operation of a middle page (MP), the control circuit 102 may provide a reading voltage VW with a voltage value of BR (as shown in FIG. 2) to the memory cells M1-M4 on the selected word line WLS and a bit line voltage VBL with a voltage value of VBN to each bit line of memory strings S1-S4 in FIG. 4. The control circuit 102 may determine the threshold voltage distribution of the memory cells M1-M4 on the selected word line WLS according to whether the memory cells M1-M4 enter the on state, and then determine the data stored in the memory cells M1-M4.

In the example of the middle page (MP), supposing that the data stored in the memory cells M1-M4 are respectively C, A, F and Er as shown in FIG. 4. From FIG. 3 it can be seen that the threshold voltage corresponding to data A and Er is less than the voltage BR. Therefore, during the reading period T1, the memory cells M2 and M4 are in the on state, while the memory cells M1 and M3 are in the off state in the example of the middle page (MP) in FIG. 4.

Figure 5:
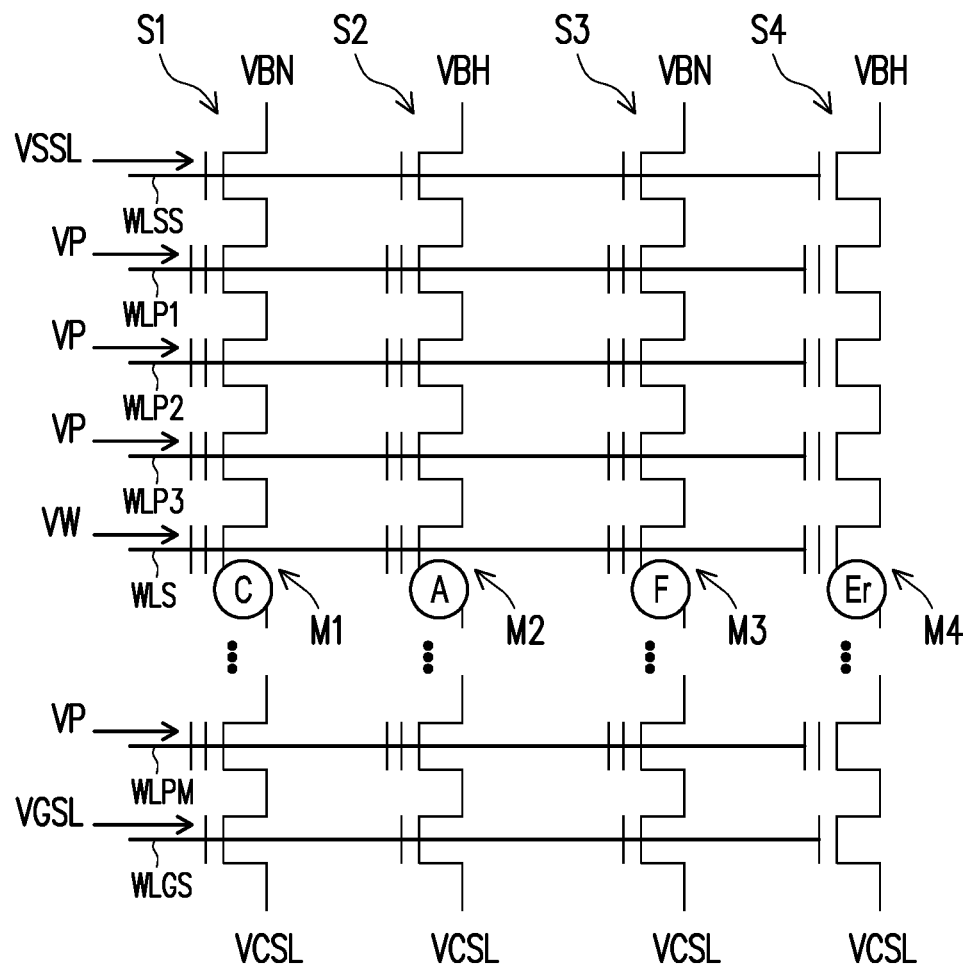

During a reading period T2, the control circuit 102 may provide a reading voltage VW with a voltage value of DR (as shown in FIG. 2) to the selected word line WLS, and determine the threshold voltage distribution of the memory cells M1 and M3 according to whether the memory cells M1 and M3 enter the on state in the middle page (MP) in FIG. 5. It is worth noting that, as illustrated in FIG. 5, the memory cells M2 and M4 are determined as the read finished memory cells in the middle page (MP) during the reading period T1. During the reading period T2, the control circuit 102 may provide a bit line voltage VBL with a voltage value of VBH to the bit lines of the memory strings S2 and S4, and provide a bit line voltage VBL with a voltage value of VBN to the bit lines of the memory strings S1 and S3. That is, during the reading period T2, the control circuit 102 provides two different bit line voltages VBL. The voltage VBH is greater than the voltage VBN. As shown in FIG. 2, the passing voltage and the bit line voltage has a voltage difference. When the bit line voltage is VBN, the voltage difference is VSTR1. When the bit line voltage is VBH, the voltage difference is VSTR2. The voltage difference VSTR1 is larger than the voltage difference VSTR2. In FIG. 5, the bit line voltage VBL with a voltage value of VBH is provided to the memory cells on the unselected word lines WLP1-WLPM in the memory strings S2 and S4. The voltage difference between the passing voltage VP and the bit line voltage VBL reduces from VSTR1 to VSTR2 for the memory cells on the unselected word lines WLP1-WLPM in the memory strings S2 and S4. Distortion of the data stored in the memory cells on the unselected word lines WLP1-WLPM in the memory strings S2 and S4 due to reading disturbance may be avoided. In addition, as illustrated in FIG. 5, since the threshold voltage corresponding to the data C is less than the voltage DR (shown in FIG. 3), during the reading period T2, the memory cell M1 in the memory string S1 is in the on state and determined as the read finished memory cell in the middle page (MP).

Figure 6:
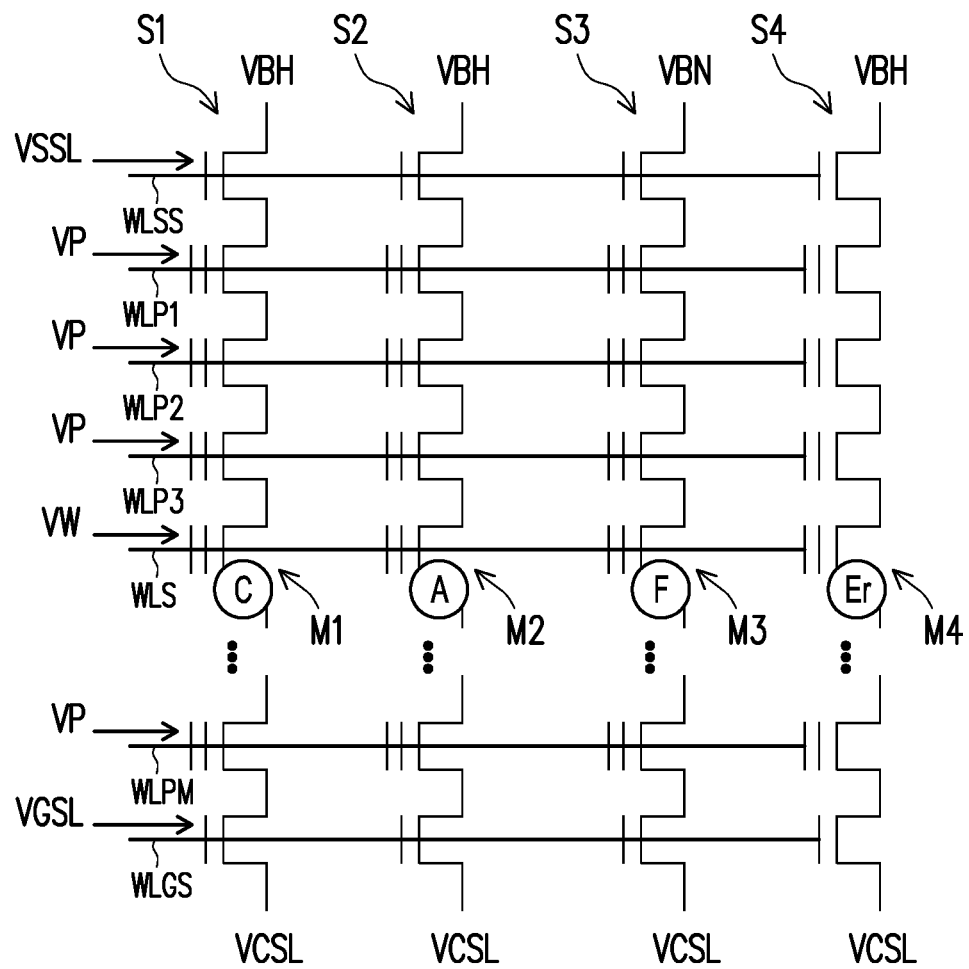

Similarly, during a reading period T3, the control circuit 102 may provide a reading voltage VW with a voltage value of FR (as shown in FIG. 2) to the selected word line WLS in the middle page (MP). As illustrated in FIG. 3, since the threshold voltage corresponding to data F is greater than the voltage FR, during the reading period T3, the memory cell M3 in the memory string S3 is in the off state. As previously mentioned, the memory cells M1, M2 and M4 has been determined as read finished memory cells during the reading periods T1 and T2. During the reading period T3 (as shown in FIG. 6) the control circuit 102 may provide a bit line voltage VBL with a voltage value of VBH to the bit lines of the memory strings S1, S2 and S4. A bit line voltage VBL with a voltage value of VBN is provided to the bit line of the memory string S3 The distortion of the data stored in the memory cells on the unselected word lines WLP1-WLPM in the memory strings S1, S2 and S4 due to reading disturbance may be avoided.

As deduced by analogy, during the reading operation of a low page (LP) and an upper page (UP) performed on the memory cells M1-M4 on the selected word line WLS, different reading voltages (voltage AR, ER, CR and GR shown in FIG. 2) may be applied to the memory cells M1-M4 in the similar way during different reading periods. After applying 7 different reading voltages to the memory cells M1-M4 on the selected word line WLS during the reading operation of the upper page, middle page and lower page, the threshold voltage distribution of the memory cells M1-M4 can be confirmed and then the data stored therein can be confirmed. Those with general knowledge in the art may deduce the detailed implementation according to the above embodiment, so the detailed descriptions about the reading operations of the lower page and the upper page are omitted here.

Figure 7:
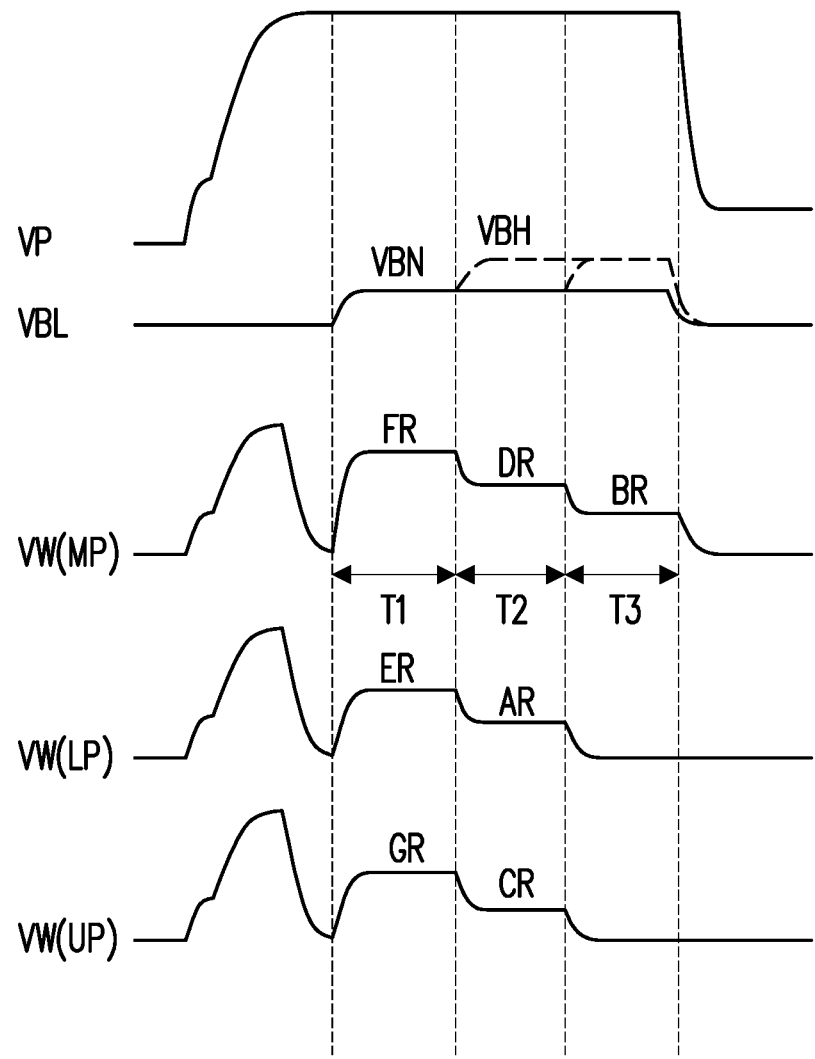
FIG. 7 is a voltage signal waveform diagram of a memory device according to another embodiment of the invention.

It is worth noting that, in the embodiment illustrated in FIG. 2, different reading voltages are provided to the memory cells M1-M4 from low to high during different reading periods to determine the data stored in the memory cells M1-M4. However, in other embodiments, the data stored in the memory cells M1-M4 may also be determined by providing different reading voltages to the memory cells M1-M4 from high to low during different reading periods. For example, as illustrated in FIG. 7, in the reading operation of the middle page, the reading voltage (FR) provided by the control circuit 102 to the memory cells M1-M4 during the reading period T1 is greater than the reading voltage (DR) provided to the memory cells M1-M4 during the reading period T2. The reading voltage (DR) provided to the memory cells M1-M4 during the reading period T2 is greater than the reading voltage (BR) provided to the memory cells M1-M4 during the reading period T3. In the present embodiment, the preset state will become the off state. If the data stored in the memory cells M1-M4 are also as illustrated in FIG. 3 and FIG. 4, which are respectively C, A, F and Er. In the present embodiment, the control circuit 102 will increase the bit line voltage from VBN to VBH of the memory string S3 during the reading period T2, since only the memory cell M3 in the memory string S3 is in the off state during the reading period T1. Since the implementation of the present embodiment is similar to that of the above embodiment and the difference only lies in that the preset state becomes to the off state, those with general knowledge in the art may deduce the detailed implementation according to the above embodiment, so the detailed descriptions about the implementation of the reading operation are omitted here.

Figure 8:
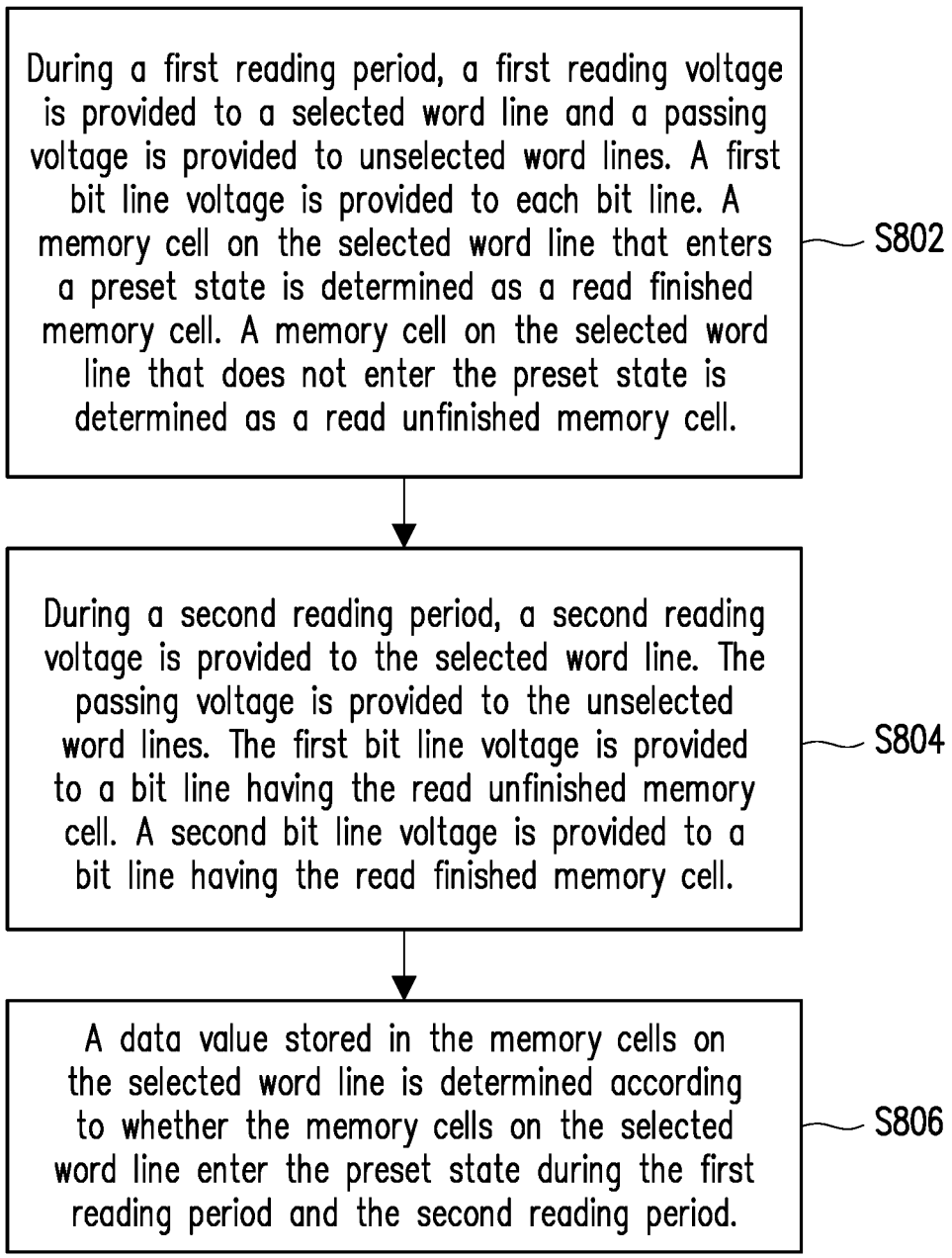
FIG. 8 is a flowchart of a reading method of a memory device according to one embodiment of the invention.

FIG. 8 is a flowchart of a reading method of a memory device according to one embodiment of the invention. The memory device comprising a plurality of memory strings. Each memory string is respectively coupled to a bit line. Each memory string includes a plurality of memory cells. Each memory cell is respectively coupled to a bit line and a word line. Please refer to FIG. 8. In this example, the reading method of the memory device may at least include the following steps. In step S802, during a first reading period, a first reading voltage is provided to a selected word line and a passing voltage is provided to unselected word lines. A first bit line voltage is provided to each bit line. A memory cell on the selected word line that enters a preset state is determined as a read finished memory cell. A memory cell on the selected word line that does not enter the preset state is determined as a read unfinished memory cell. The memory cells may be, for example, multi level cells, triple level cells or quadruple level cells. In step S804, during a second reading period, a second reading voltage is provided to the selected word line. The second reading voltage could be larger or smaller than the first reading voltage. The passing voltage is provided to the unselected word lines. The first bit line voltage is provided to a bit line having the read unfinished memory cell. A second bit line voltage is provided to a bit line having the read finished memory cell. The second bit line voltage is greater than the first bit line voltage. By providing the second bit line voltage during the second reading period to the bit line having the read finished memory cell, the voltage difference between the bit line voltage and the pass voltage of the memory cells on the unselected word lines is reduced. The preset state may be an on state or off state. For example, when the first reading voltage is less than the second reading voltage, the preset state is the on state, and when the first reading voltage is greater than the second reading voltage, the preset state is the off state. In step S806, a data value stored in the memory cells on the selected word line is determined according to whether the memory cells on the selected word line enter the preset state during the first reading period and the second reading period.

To sum up, during the second reading period, the control circuit provides the second bit line voltage to the bit line having the read finished memory cell. Thus, the voltage difference between the bit line voltage and the passing voltage of the memory cells on the unselected word lines is reduced. Distortion of stored data of the memory cells on the unselected word lines caused by the lengthening of the reading time is avoided, and reading disturbance is effectively avoided.

Although the invention has been disclosed with reference to the above embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:
1. A memory device, comprising:
 a plurality of memory strings, each memory string comprising a plurality of memory cells, each memory cell comprising a threshold voltage indicating a stored data value;

a plurality bit lines, each bit line of the plurality bit lines being coupled to each corresponding memory string respectively;

a plurality word lines, each word line of the plurality word lines being coupled to each corresponding memory cell in the plurality of memory string respectively; and a control circuit being coupled to the plurality of memory strings and configured to, during a first reading period, provide a first reading voltage to a selected word line, provide a passing voltage to unselected word lines, provide a first bit line voltage to each bit line, determine a memory cell on the selected word line that enters a preset state as a read finished memory cell, and determine a memory cell on the selected word line that does not enter the preset state as a read unfinished memory cell;

during a second reading period, provide a second reading voltage to the selected word line, provide the passing voltage to the unselected word lines, provide the first bit line voltage to a bit line having the read unfinished memory cell, and provide a second bit line voltage to a bit line having the read finished memory cell, wherein the first bit line voltage is different from the second bit line voltage, and determine a data value stored in memory cells on the selected word line according to whether the memory cells on the selected word line enter the preset state during the first reading period and the second reading period.

2. The memory device according to claim 1, wherein the second bit line voltage is greater than the first bit line voltage.

3. The memory device according to claim 1, wherein the preset state is an on state or off state.

4. The memory device according to claim 3, wherein when the first reading voltage is less than the second reading voltage, the preset state is the on state, and when the first reading voltage is greater than the second reading voltage, the preset state is the off state.

5. The memory device according to claim 1, wherein the memory cells comprise multi level cells, triple level cells or quadruple level cells.

6. A reading method of a memory device, the memory device comprising a plurality of memory strings, a plurality bit lines and a plurality word lines, each memory string comprising a plurality of memory cells, each memory cell comprising a threshold voltage indicating a stored data value, each bit line of the plurality bit lines being coupled to each corresponding memory string respectively, each word line of the plurality word lines being coupled to each corresponding memory cell in the plurality of memory string respectively, the reading method of the memory device comprising:

during a first reading period, providing a first reading voltage to a selected word line, providing a passing voltage to unselected word lines, providing a first bit line voltage to each bit line, determining a memory cell on the selected word line that enters a preset state as a read finished memory cell, and determining a memory cell on the selected word line that does not enter the preset state as a read unfinished memory cell;

during a second reading period, providing a second reading voltage to the selected word line, providing the passing voltage to the unselected word lines, providing the first bit line voltage to a bit line having the read unfinished memory cell, and providing a second bit line voltage to a bit line having the read finished memory cell, wherein the first bit line voltage is different from the second bit line voltage; and determining a data value stored in memory cells on the selected word line according to whether the memory cells on the selected word line enter the preset state during the first reading period and the second reading period.

7. The reading method of the memory device according to claim 6, wherein the second bit line voltage is greater than the first bit line voltage.

8. The reading method of the memory device according to claim 6, wherein the preset state is an on state or off state.

9. The reading method of the memory device according to claim 8, wherein when the first reading voltage is less than the second reading voltage, the preset state is the on state, and when the first reading voltage is greater than the second reading voltage, the preset state is the off state.

10. The reading method of the memory device according to claim 6, wherein the memory cells comprise multi level cells, triple level cells or quadruple level cells.

\* \* \* \* \*